United States Patent
Patidar et al.

(10) Patent No.: US 10,685,157 B2
(45) Date of Patent: Jun. 16, 2020

(54) POWER-AWARE SCAN PARTITIONING

(71) Applicant: Taiwan Semiconductor Manufacturing Company, Ltd., Hsinchu (TW)

(72) Inventors: Ankita Patidar, Hsinchu (TW); Sandeep Kumar Goel, Hsinchu (TW); Yun-Han Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 3 days.

(21) Appl. No.: 16/135,804

(22) Filed: Sep. 19, 2018

(65) Prior Publication Data
US 2019/0094303 A1    Mar. 28, 2019

Related U.S. Application Data

(60) Provisional application No. 62/564,841, filed on Sep. 28, 2017.

(51) Int. Cl.
| | |
|---|---|
| *G06F 30/333* | (2020.01) |
| *G01R 31/3185* | (2006.01) |
| *G01R 31/317* | (2006.01) |
| *G06F 30/00* | (2020.01) |

(52) U.S. Cl.
CPC ..... *G06F 30/333* (2020.01); *G01R 31/31721* (2013.01); *G01R 31/318536* (2013.01); *G01R 31/318541* (2013.01); *G01R 31/318575* (2013.01); *G01R 31/318583* (2013.01); *G06F 30/00* (2020.01)

(58) Field of Classification Search
CPC .......... G06F 30/333; G01R 31/318583; G01R 31/318536; G01R 31/318541
See application file for complete search history.

(56) References Cited

U.S. PATENT DOCUMENTS

| | | | | |
|---|---|---|---|---|
| 7,188,323 | B2* | 3/2007 | Wang | G01R 31/318544 |
| | | | | 714/726 |
| 2004/0015803 | A1* | 1/2004 | Huang | G06F 30/39 |
| | | | | 716/103 |
| 2005/0228616 | A1* | 10/2005 | Huang | G06F 30/30 |
| | | | | 702/181 |
| 2007/0234157 | A1* | 10/2007 | Rajski | G01R 31/318547 |
| | | | | 714/728 |
| 2009/0288045 | A1* | 11/2009 | Chien | G06F 30/327 |
| | | | | 716/103 |
| 2015/0248515 | A1* | 9/2015 | Lin | G01R 31/318533 |
| | | | | 716/136 |

* cited by examiner

*Primary Examiner* — Joseph D Torres
(74) *Attorney, Agent, or Firm* — Merchant & Gould P.C.

(57) ABSTRACT

Methods of a scan partitioning a circuit are disclosed. One method includes calculating a power score for circuit cells within a circuit design based on physical cell parameters of the circuit cells. For each of the circuit cells, the circuit cell is assigned to a scan group according to the power score for the circuit cell and a total power score for each scan group. A plurality of scan chains is formed. Each of the scan chains is formed from the circuit cells in a corresponding scan group based at least in part on placement data within the circuit design for each of the circuit cells. Interconnect power consumption can be assessed to determine routing among circuit cells in the scan chains.

17 Claims, 11 Drawing Sheets

POWER-AWARE SCAN PARTITIONING

CROSS-REFERENCE TO RELATED APPLICATIONS

The present application claims priority from U.S. Provisional Patent Application No. 62/564,841, filed on Sep. 28, 2017, the disclosure of which is hereby incorporated by reference in its entirety.

BACKGROUND

Scan-based testing is widely used in Very Large Scale Integration (VLSI) circuits. Such scan-based testing involves incorporating scan chain circuit paths into designed circuits such that scan test patterns can be applied to assess proper operation of the flip-flops and gates included in such circuits. Scan chain circuitry can typically cover 10-40% of the total circuit area of a VLSI circuit.

In general, power consumption during scan-based testing is much higher than power consumption during typical operation of a VLSI circuit. Depending upon the scan test pattern applied and the cells of the VLSI circuit to which it is applied, a power drop or local hot spot can develop. This is due in part to the various standard cells included in the circuit having different power consumption due to driving strength, size, and other design characteristics, as well as combinations of data transitions that might occur during application of a scan test pattern that would typically not occur during normal operation. Power drop or local hot spots can result in a determination of a false failure of the circuit, or may even cause permanent damage to the circuit under testing. Accordingly, minimizing the possibility of local hot spots from occurring is preferable.

To address the possibility of such local hot spots, various approaches have been taken for purposes of designing scan chains. Generally, for a given circuit design, a scan chain is inserted such that the scan length (number of flip flop transitions through the scan chain) and/or scan wire length is minimized in an effort to minimize hot spots (e.g., by reducing transitions). However, this often results in localized scan chains within the circuit, leading to the potential of localized hotspots if a scan test pattern results in a large number of flip flop state transitions during a scan test. Furthermore, once scan chains are designed for a circuit, a test pattern is applied and power consumption is estimated, based on an assumption that all scan chains are active at one time. This is based, for example, on an intended test pattern to be applied. If a power budget is exceeded, one or more scan chains can be shifted and a power budget can be reassessed until test power is no longer an issue. However, shifting of scan chains may be inadequate to adjust an overall power budget. Furthermore, because one specific scan chain may involve the greatest amount of power consumption, hot spots may develop within the circuit based on the designed scan chains.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
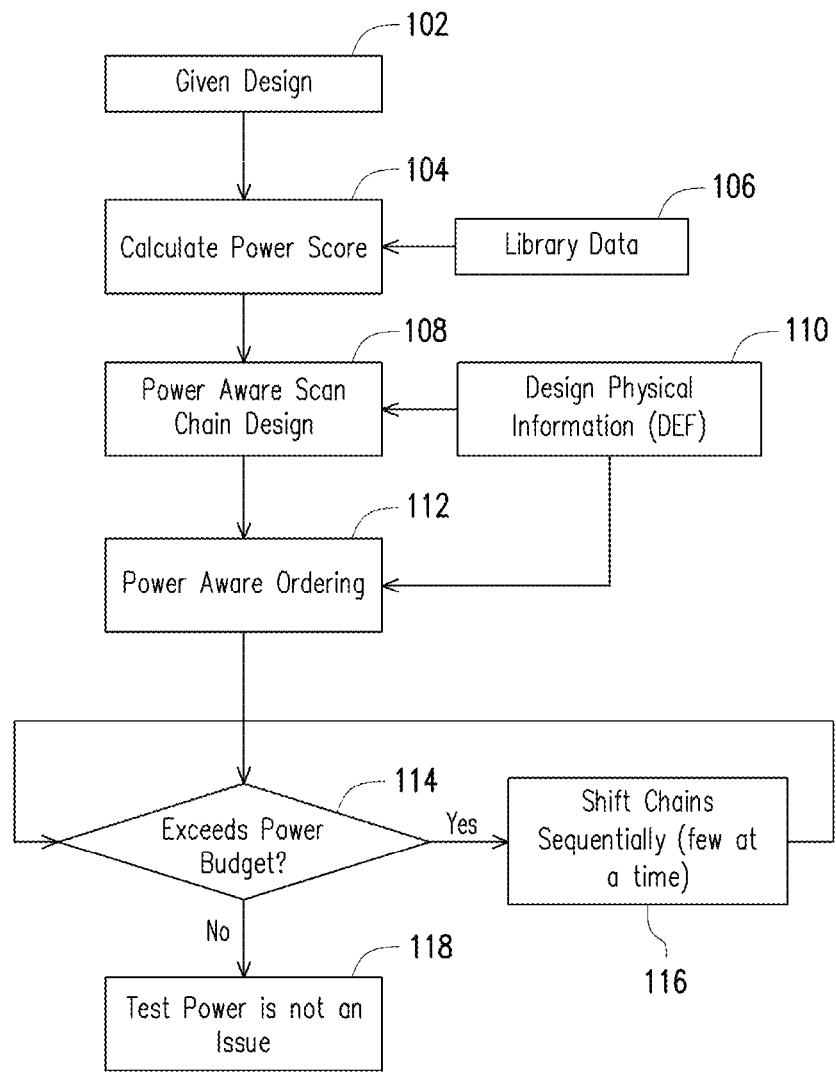
FIG. 1 illustrates an example method of partitioning a circuit into scan chains based on anticipated power consumption of circuit features, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It is noted that in existing approaches, a scan chain would be inserted in a given design with a goal of minimizing scan length or scan wire length, and a total power would be estimated if all scan chains are active at the same time. A test pattern from an automatic test pattern generator (ATPG) would be applied, and can be adjusted to adjust power consumption. The various circuit cells, or flops, within the scan chain could be re-ordered based on the test pattern generated to reduce the number of flop transitions, and therefore reduce the total power consumption. To the extent a power budget is exceeded, one or more scan chains could then be manually adjusted on an as-needed basis until test power is no longer an issue.

In general, the present disclosure relates to a methodology for selecting and arranging scan chains within an integrated circuit. The methodology considers power consumption of each circuit cell to be included in a scan chain. In example embodiments, power scores are calculated for each circuit cell to be included in a scan chain that is included in a given circuit design. Scan chains are formed by assigning circuit cells to scan groups based on the power score for the scan group as well as the power score for the circuit cell. Scan chains are formed from the scan groups of circuit cells based at least in part on placement data within the circuit design for the circuit cells. In some cases, this can account for interconnect power scores, and can also avoid localization of hot spots within an overall circuit design, for example by dispersing circuit cells within a single scan chain across a circuit design. The methodology described herein presents a number of advantages over existing approaches. For example, the scan chain design is not dependent upon a test pattern generator tool or other power tool that may generate test patterns having a high switching rate, causing higher than desired power consumption during testing. Furthermore, hot spot areas can be quickly identified and avoided, without requiring a trial and error approach.

Referring now to FIG. 1, an example method 100 of partitioning a circuit into scan chains based on anticipated power consumption of circuit features, in accordance with some embodiments. The method 100 can be performed using a scan chain design tool, for example as may be included in an integrated circuit design and layout software tool.

In the embodiment shown, a given design (shown as design 102) is received at a scan chain design tool. In some instances, the design 102 can be received in the form of a design definition file. A power score is calculated at the scan chain design tool (step 104). The power score can be calculated based on the given design and library data 106, which can include information describing physical parameters of each standard cell type for each flop to be included in a design. The parameters can include, for example, a number of transistors included in a circuit cell, size of the transistors, a threshold voltage used by the circuit cell, a number of fins, fin width and height and channel oxide (for finFET designs), and a maximum load or drive strength of the circuit cell. In example embodiments, the power score is calculated for each circuit cell to be included in a scan chain.

In example embodiments, the power score calculation of step 104 is performed for each circuit cell. The specific parameters for each cell can be extracted from the library data 106, including the number of transistors, a width W, a length L, a number of fins $n_{fin}$, a multiplier m, finger f, fin height $H_{fin}$, and threshold voltage $V_t$. The parameters can be normalized to a common maximum value, and a power score calculated for each circuit cell according to the following formula:

$$\text{Power Score} = _{i=1}\Sigma^n(\alpha \times Sz + \beta \times Vt)$$

In conjunction with this formula, n is the number of transistors in the circuit cell for which the power score is calculated, $V_t$ is a threshold voltage of the transistors (normalized), and Sz is the size of the transistor (normalized over a maximum value). Sz can be determined based on a proportional effective width to length ($W_{eff}/L$), where the effective width corresponds to $W*m*f$ for a planar MOSFET, or $n_{fin}*(2*H_{fin}+W)$ for a FinFET.

In the embodiment shown, after power scores are calculated for each circuit cell, a power aware scan chain design can be executed, in which the circuit cells are added to one of a predetermined number of scan groups (step 108). The power aware scan chain design can be based on the power scores of the circuit cells to be included in the various scan chains, as well as physical information of the design, identified as design physical information 110. The physical information of the design can include, for example, placement data for the design, including, in some cases, placement data for each of the circuit cells included in scan chains, as well as placement data for other circuit cells or interconnect included in the circuit design. As referred to herein, scan groups correspond to groups of circuit cells, or flops, that will be included in a scan chain, and a scan chain corresponds to an ordered scan group, including interconnect features. Details regarding a possible example of apportioning circuit cells to scan groups are provided below, in connection with FIG. 3.

In the example embodiment shown, once circuit cells are apportioned to scan groups, a power aware ordering operation can be performed (step 112). The power aware ordering can be performed on each scan group, and involves ordering the circuit cells, or flops, within the scan group to form a scan chain. The power aware ordering operation receives design physical information 110 as well as the scan groups, to determine an appropriate order of cells in the scan group in which to form a scan chain, based at least in part on positioning of the cells and interconnect that would be required to form the scan chains.

Once scan chains are selected and formed for a given design, a power assessment operation is performed (operation 114) to determine whether a power budget for the given design has been exceeded. The power budget can be, for example, a maximum power consumption level set for a particular circuit design to ensure a target power consumption by the integrated circuit is met. If operation 114 determines that the power budget is exceeded, scan chains can be shifted (step 116). This has the effect of fewer scan chains being activated at the same time, which reduces power consumption. Additionally, in this equation, α and β are constants associated with process technology.

If a power budget is not exceeded at operation 114, test power is not an issue and the scan chain design can be used (step 118).

Figure 2A:
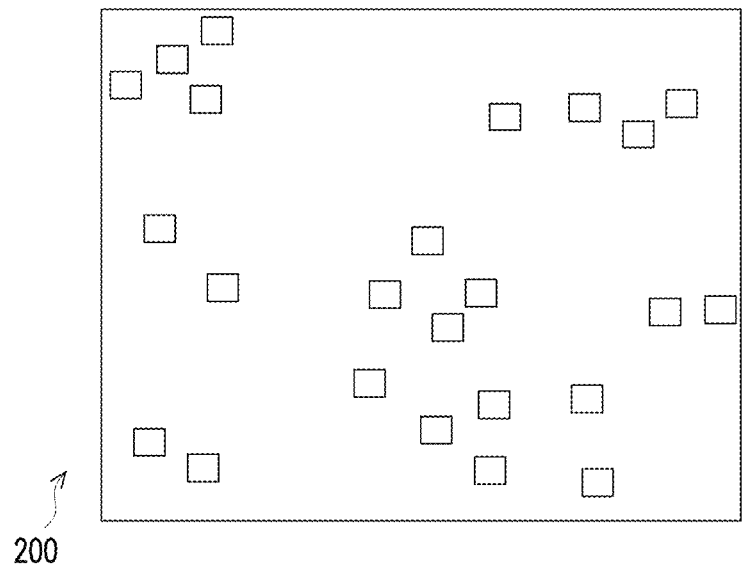
FIG. 2A illustrates an example arrangement of circuit cells in accordance with some embodiments.
Figure 2B:
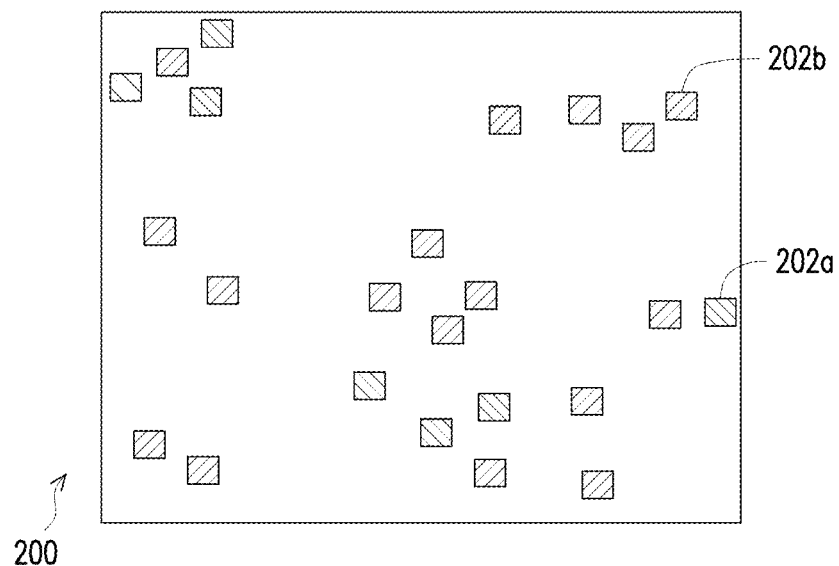
FIG. 2B illustrates the example arrangement of circuit cells of FIG. 2A, identifying power hungry cells.

Referring now to FIGS. 2A-2E, an example sequence for forming scan chains according to the method described above in FIG. 1 is illustrated. FIG. 2A illustrates an example design 200 for which scan chains are to be formed. The design 200 includes a plurality of circuit cells, or flops, to be included in scan chains. As seen in FIG. 2B, after a power score is calculated for each cell based on library data and the design, cells can be identified as "power hungry" in that they have higher power requirements (e.g., by having larger features, greater fanout, etc.). In the embodiment shown, the design includes highlighted circuit cells (one example of which is denoted 202a), identified as "power hungry" cells, and circuit cells identified as "normal" cells, one example of which is denoted as 202b. Such a separation can be based on a particular power consumption threshold, depending on the power budget and circuit technology used.

Figure 2C:
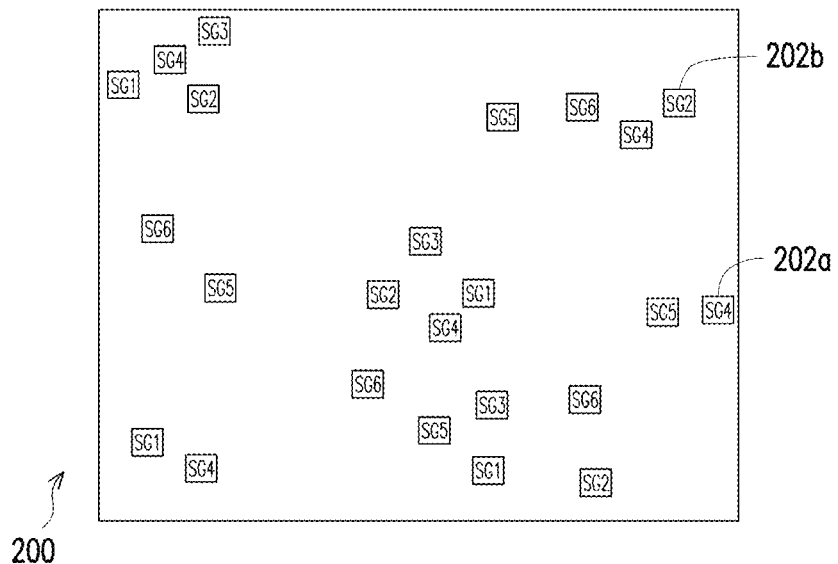
FIG. 2C illustrates the example arrangement of circuit cells of FIG. 2A with the power hungry cells partitioned into scan chains, according to an example embodiment.
Figure 2D:
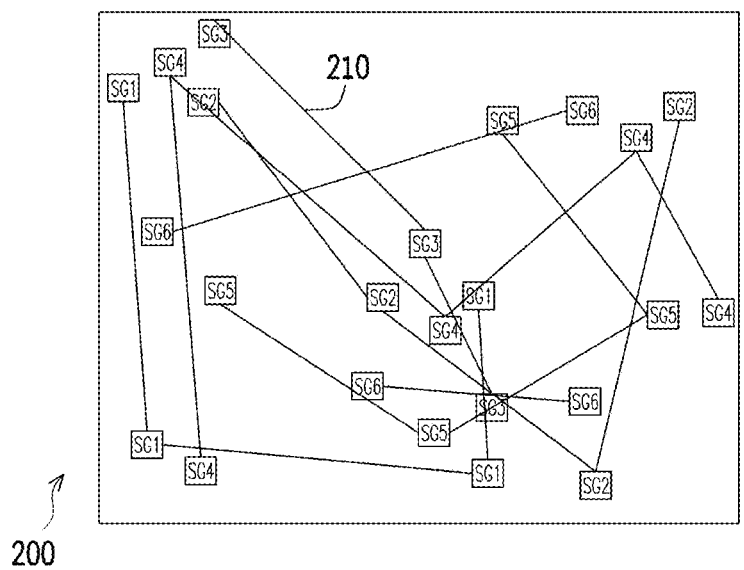
FIG. 2D illustrates the example arrangement of circuit cells of FIG. 2A ordering each of the circuit cells within scan chains, according to an example embodiment.

FIG. 2C illustrates assigning the circuit cells to scan groups ("SG"). As seen in FIG. 2C, each of the "power hungry" cells 202a are distributed across the scan groups to avoid concentrating too many such cells in a single scan group. This arrangement decreases a likelihood that a particular scan chain will cause a hotspot or otherwise exceed a power budget during scan testing. FIG. 2D illustrates forming scan chains (one example of which is illustrated as 210) among the circuit cells included in the scan groups. As seen in FIG. 2D, the scan chains are formed by establishing paths and sequences of circuit cells among the scan groups. Details regarding selection of paths and sequences are provided below in connection with FIG. 3.

Figure 2E:
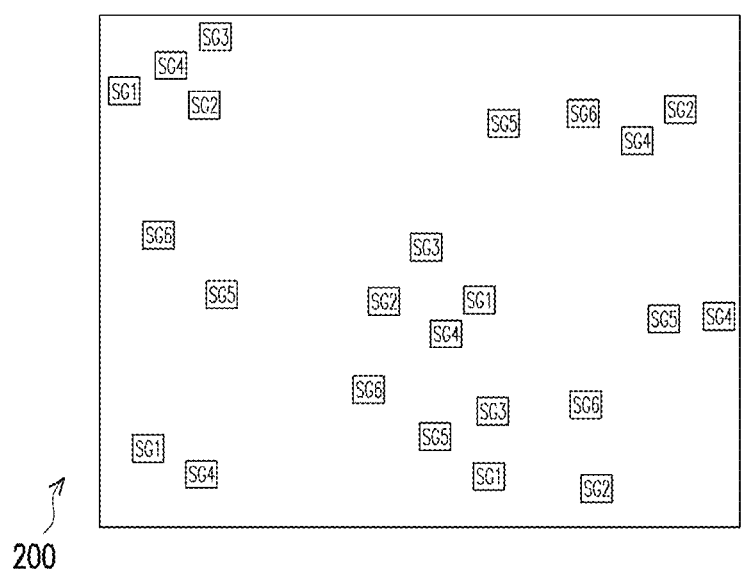
FIG. 2E illustrates a hot spot map based on the power-aware scan chain design illustrated in FIGS. 2A-2D.

As reflected generally in FIG. 2E, a resulting heat distribution from the scan chains formed in FIG. 2D is distributed due to distribution of cells across the circuit area, rather than minimizing scan interconnect length, which results in scan chains (and heat generation) localized in one particular area of the circuit. As illustrated, rather than concentrating a single scan chain in a small area of the circuit, each scan chain, including circuit cells and related interconnect, is distributed across the circuit, resulting in distributed heat and reducing the likelihood of hot spots forming during scan-based testing.

Figure 3:
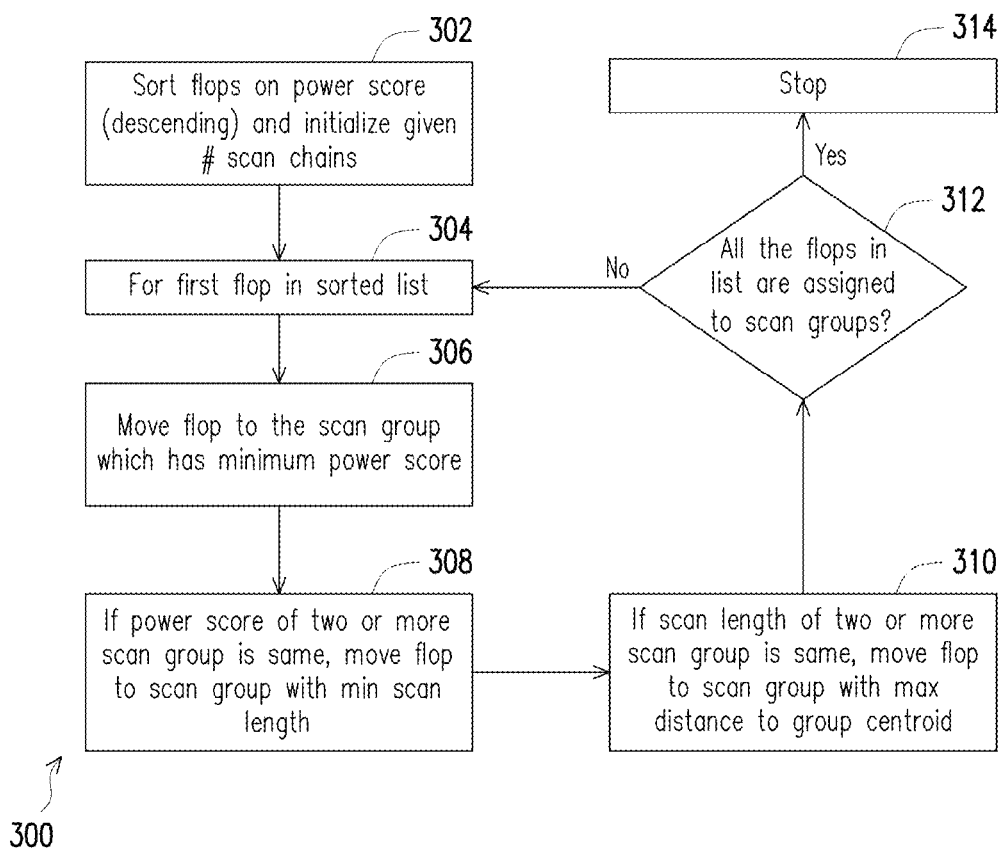
FIG. 3 illustrates a method of assigning circuit cells into scan groups, according to an example embodiment.

Referring now to FIG. 3, a method 300 for assigning circuit cells into scan groups is shown, according to an example embodiment. The method 300 can be performed, for example, to perform a power aware scan chain design, and in particular to group circuit cells into scan groups that will subsequently be included in scan chains. The method 300 can be performed, for example, once power scores for each flop, or circuit cell, to be included in a scan chain has been calculated.

In the example shown, the method 300 include sorting the flops, or circuit cells, into a list of currently-unassigned flops, in descending order based on the power score, and selecting a number of scan chains into which those circuit cells will be sorted (step 302). The number of scan chains can be decided by a user, and may be based on the extent of scan-based test features desired to be included in the circuit design.

Once the list of circuit cells is arranged in descending order, a first flop, or circuit cell, is selected from the list (step 304). Alternatively to sorting and selecting, simply selecting a circuit cell having a highest calculated power score can be performed.

Once the circuit cell with a current highest power score is selected from among the available or unassigned circuit cells, that circuit cell, or flop, is assigned to a scan group having a minimum power score from among the scan groups that are to be used in forming scan chains (step 306). If a power score of two scan groups is the same, the flop, or circuit cell, will be assigned to be added to a scan group that has a minimum scan length (i.e., the fewest number of flops or circuit cells to achieve that power score) (step 308). It is assumed that such a scan group will result in a scan chain have a lower overall power score than a scan group with a greater number of flops or circuit cells due to the additional interconnect that is required for interconnecting such a larger scan group.

If the length of two scan groups is the same (i.e., they have the same number of flops), the circuit cell at issue, having a highest power score among currently-unassigned circuit cells, is assigned to a scan group that has a maximum distance between the circuit cell at issue and a current centroid of the scan group (step 310). By assigning circuit cells to scan groups having a maximum distance from the centroid of the scan group, hot spots formed in situations where circuit cells are located close to each other within a common scan group can be reduced.

Once the circuit cell, or flop, is assigned to a scan group, the method 300 can proceed to determine whether all flops from the list of unassigned flops have been assigned to a scan group (operation 312). If not all flops, or circuit cells, have been assigned, operation returns to step 304, in which a next flop in the sorted list (alternatively, the highest-power flop remaining unassigned to a scan group) is considered for assignment to a scan group. If all flops, or circuit cells, are assigned to a scan group, the method 300 is completed (step 314).

It is noted that, overall, the methodology described in FIG. 3 results in distribution of high-power circuit cells across scan groups. Although at an initial stage all scan groups will have an aggregate power score of zero, as each circuit cell is considered, the circuit cells will be assigned to a lowest-power scan group, with priority toward assigning high-power circuit cells to lowest-power scan groups.

Figure 4A:
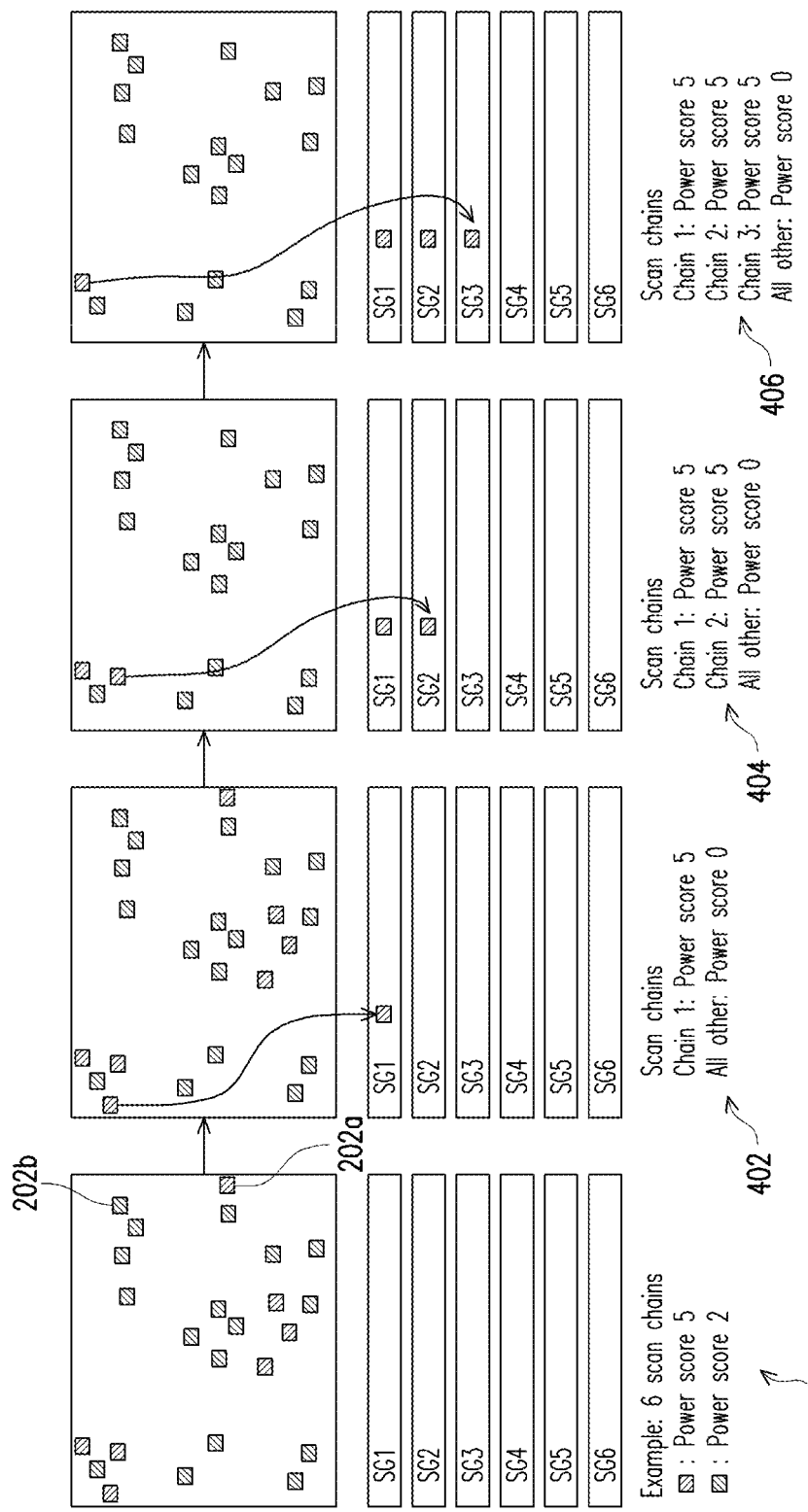
FIG. 4A illustrates the example process of FIG. 3 as performed on a first subset of the circuit cells of FIGS. 2A-2E.
Figure 4B:
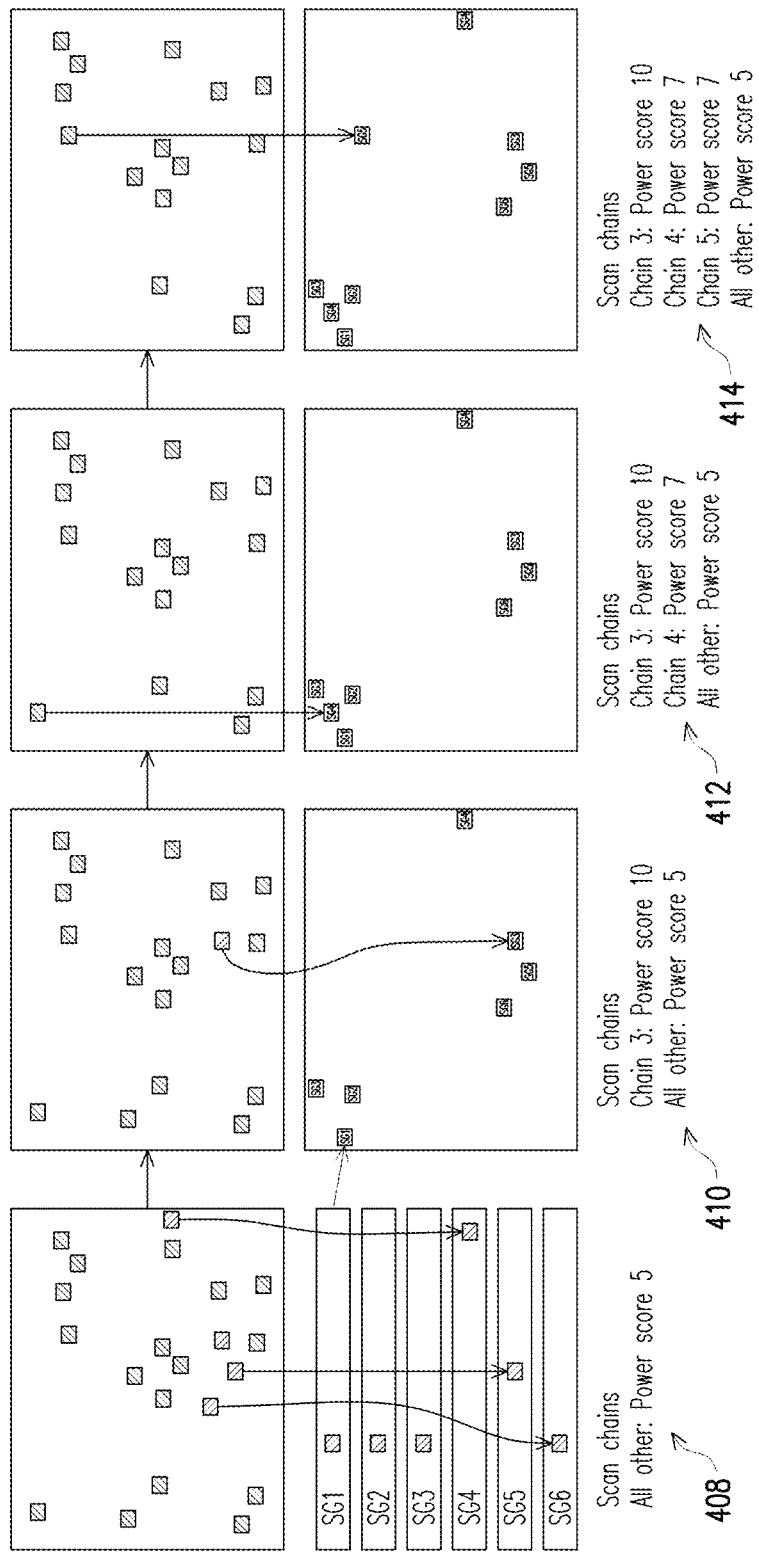
FIG. 4B illustrates the example process of FIG. 3 as performed on a second subset of the circuit cells of FIGS. 2A-2E.
Figure 4C:
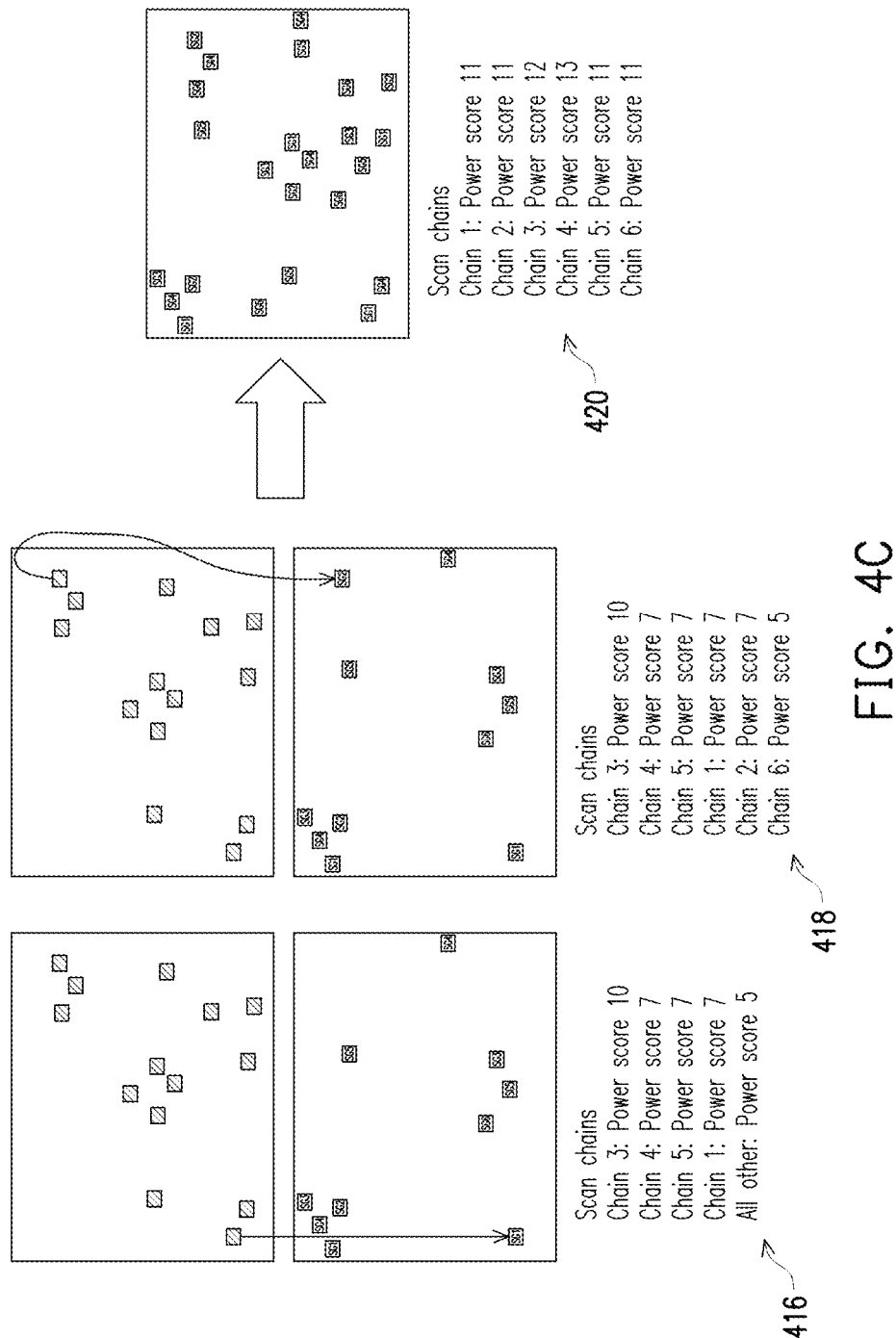
FIG. 4C illustrates the example process of FIG. 3 as performed on a third subset of the circuit cells of FIGS. 2A-2E.

Referring now to FIGS. 4A-4C, an example sequence 400 of assigning circuit cells to scan groups is illustrated, using the method described above in connection with FIG. 3. The sequence of FIG. 4A-4C uses the example circuit design illustrated in FIGS. 2A-2F, in which certain circuit cells were identified as high power circuit cells 202a.

In the example sequence 400 as shown, a design 200 includes a plurality of circuit cells 202, as noted above, which are to be included in scan chains. In the example shown, six scan chains are selected for inclusion in the scan-based testing design; however, in alternative examples, more or fewer scan chains could be used.

As described above, each circuit cell to be included in a scan chain has a power score calculated based on the characteristics of that circuit cell. For purposes of illustration, it is assumed that, among the plurality of circuit cells 202, a collection of high power circuit cells 202a have a power score of 5 and lower powered circuit cells 202b have a power score of 2.

Once ordered, a highest power score circuit cell is selected and added to a scan group having a lowest aggregate power score. In particular, in a first assignment step 402, a circuit cell having highest power (power of 5) is assigned to one of the scan groups. Because at this point no scan groups have any circuit cells assigned, all have an aggregate power score of 0, and the circuit cell can be assigned to any of those scan groups.

In a second assignment step 404, a second-highest power score circuit cell (e.g., another circuit cell having power of 5, in this example) is assigned to a lowest-power score scan group. In this case, any of the scan groups that did not have a circuit cell assigned in step 402 would be acceptable, since only that first scan group has a non-zero aggregate power score. Similarly, in a third assignment step 406, a third-highest power score circuit cell is assigned to a scan group having a lowest power score. Here, another circuit cell having a power score of 5 is assigned to another remaining scan group having a power score of zero.

As seen in FIG. 4B, at step 408, assignment of circuit cells having high power scores continues, such that each of the six scan groups have a high power cell associated therewith, and all scan groups in this example therefore have a common power score. In step 410, a circuit cell having a high power score requires assignment to a scan group; since all scan groups have the same scan length (each has a single circuit cell), the circuit cell is assigned to a scan group that is a maximum distance from that circuit cell. In this instance, since the circuit cell in scan group 3 is a furthest distance from the circuit cell to be assigned, the circuit cell to be assigned is added to that scan group, resulting in scan group 3 having an aggregate power score of 10, with all other scan groups having an aggregate power score of 5.

In step 412, since all circuit cells having a high power score have been assigned to scan groups in this example, a next circuit cell to be assigned is one of the circuit cells having an average power score of 2. This next circuit cell is added to scan chain 4, due to (1) each of scan groups 1, 2, and 4-6 having only one circuit cell, (2) each of scan groups 1, 2, and 4-6 having a common power score, and (3) scan group 4 having a circuit cell furthest away from the circuit cell to be assigned. Similarly, in step 414, a next selected circuit cell is added to scan chain 5, given that it (1) has a lowest power score (common lowest score of 5 for each of scan groups 1, 2, 5-6), (2) each of those scan groups has the same number of circuit cells assigned, and (3) scan group 5 has a distance furthest from the circuit cell to be assigned.

Referring now to FIG. 4C, the sequence of assignment of circuit cells continues at step 416, which illustrates assignment of a circuit cell having a normal power score of 2 to scan group 1. In this example sequence, the circuit cell is assigned to a scan group from among the remaining scan groups (1, 2, 6) that have a lowest power and a same current scan length (each having one circuit cell). The circuit cell is specifically assigned to scan group 1 based on the circuit cell being furthest away from the centroid of scan group 1, as compared to scan groups 2 and 6. At step 418, the same assignment occurs with respect to a next circuit cell, but selecting from among remaining lowest-power scan groups 2 and 6 (thereby assigning to scan group 2). Ultimately, as seen in resulting assignments at step 420, each of the circuit cells is assigned to a scan group, and power scores of the scan groups are distributed such that no scan group has a disproportionately high power score and therefore would have a higher likelihood of exceeding a power budget.

Figure 5:
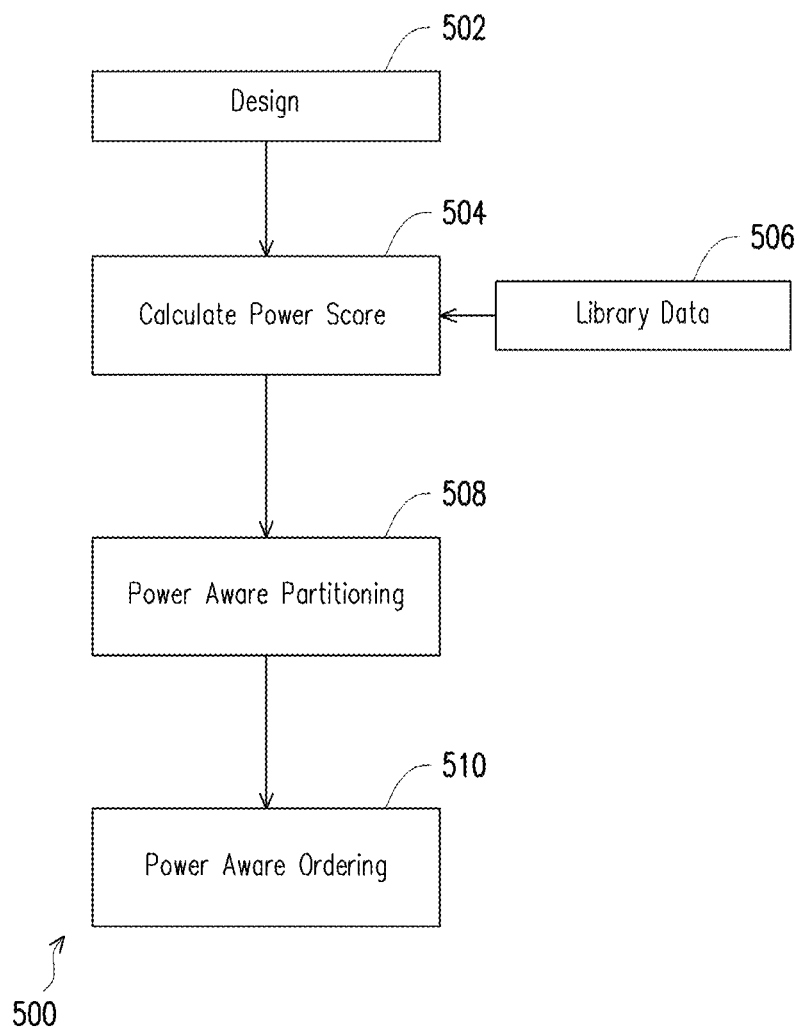
FIG. 5 illustrates an example method of partitioning a circuit into scan chains based on anticipated power consumption of circuit features, in accordance with one particular embodiment.
Figure 6:
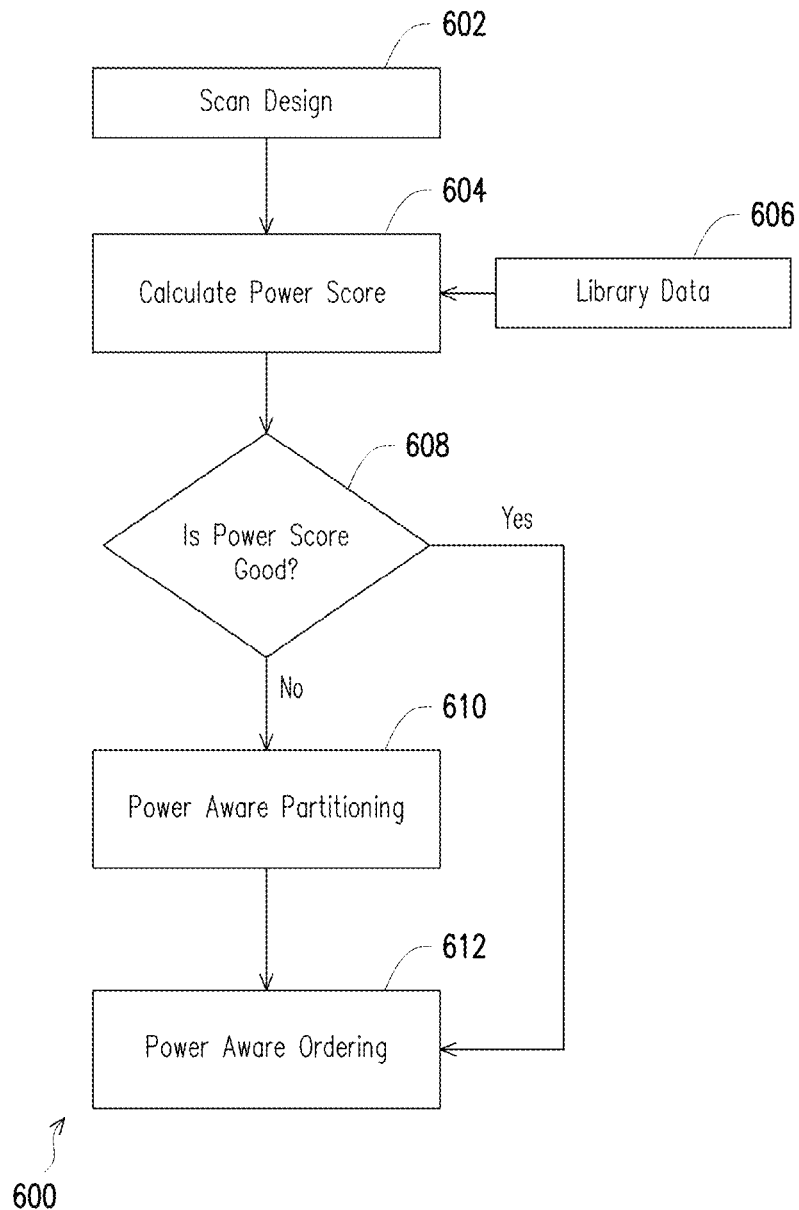
FIG. 6 illustrates an example method of partitioning a circuit into scan chains based on anticipated power consumption of circuit features, in accordance with a second particular embodiment.

Referring now to FIGS. 5-6, additional methods of partitioning a circuit into scan chains based on anticipated power consumption of circuit features. In the examples of FIG. 6, an existing scan chain design can be assessed, for example a design including a previously-incorporated scan chain is provided as input. In such an example, the scan chains can be assessed and adjusted using principles similar to those disclosed above to improve thermal and power consumption performance of a given scan chain design.

Referring now to FIG. 5, a general method of partitioning a circuit into scan chains is discussed. In this example a design 502 is received, which corresponds to a circuit definition file. A power score is then calculated for each circuit cell included in the scan chains, or in the scan chain design overall (step 504). This power score calculation corresponds generally to the same type of calculation described above in connection with FIG. 1, step 104. The power score calculation can be performed using library data 506, also corresponding generally to the library data 106 of FIG. 1. In example embodiments, the library data 506 and/or the design 502 can include, for example, in addition to the types of information in the design 102 and library data 106 of FIG. 1, additional information relating to routing of interconnect between circuit cells in scan groups.

In the embodiment shown, the method 500 can include one or both of a power aware partitioning process (step 508) and a power aware ordering process (step 510). The power aware partitioning process of step 508 generally corresponds to the sequence of assigning circuit cells to scan groups, such as is seen in FIG. 3, above, and the sequence described in connection with FIGS. 4A-4C. The power aware ordering process of step 510 corresponds generally to selecting a sequence among the circuit cells included within a scan group in which to form a scan chain.

Optionally, if scan chains are predefined (e.g., as in the embodiment seen in FIG. 6), power aware ordering can be performed on a scan chain, as opposed to a scan group, by calculating not just a total power score for all circuit cells, but also for interconnect designed to connect those circuit cells. In other words, a total power score for a particular scan chain can be calculated from the following expression:

Scan Chain Power Score=ΣCell Power Score+ΣInterconnect Power Score

Since the aggregated cell power score is calculated as a sum of the individual circuit cell power scores that are calculated as above, those values can be added to the interconnect power score. The interconnect power score represents a sum of the power scores of physical wiring between interconnected circuit cells within a scan chain. The interconnect power score between two interconnected circuit cells can be calculated using the following expression:

Interconnect Power Score=$(_{i=1}\Sigma^n L_i/W_i)+N_{via}$

In this arrangement, n is the number of metal layers, $L_i$ corresponds to the length of wire in the corresponding metal layer, $W_i$ corresponds to the width of the wire in the corresponding metal layer, and $N_{via}$ represents a number of vias in the routing path.

To achieve a minimum interconnect power score, a travelling salesman algorithm can be applied to each scan chain, with the input weights for the algorithm are the Interconnect Power Score calculated, as above, for the wire connections between interconnected circuit cells. Specifically, the travelling salesman algorithm minimizes the distance covered between points to be intersected; as applied here, the travelling salesman algorithm uses the cells to be included in each scan chain and determines a minimum scan chain power score possible by minimizing the interconnect lengths for connecting scan chains therebetween. Minimized interconnect length results in a lower overall power score, since the result of such a calculation will be a minimization of the overall interconnect power score for the scan chain interconnect, hence, reduced overall power consumption of the scan chain design.

Referring to FIG. 6, a particular example method 600 is disclosed for partitioning a circuit into scan chains based on anticipated power consumption of circuit features. In the example shown, the method 600 includes receiving a design 602 and calculating a power score of circuit cells in the design (step 604) based on library data 606, corresponding generally to the analogous features 502-506 of FIG. 5. However, in FIG. 6, a power score assessment operation will determine whether the power score is acceptable, relative to a particular metric (operation 608). The metric can be, for example, whether the power score exceeds a particular threshold (e.g., a planned power budget) or whether the power scores for the scan groups and scan chains is relatively evenly distributed.

If the power score is not acceptable according to the selected metric, a power aware partitioning process (step 610) can be performed, analogously to the power aware partitioning process in step 508 of FIG. 5. Following the power aware partitioning process, or, if the power score is determined to be "good" in operation 608 (e.g., meets a particular threshold), a power aware ordering process (step 612) is performed, analogously to the power aware ordering process of step 510 of FIG. 5. In other words, when comparing FIGS. 5-6, in the embodiment of FIG. 6, the power aware partitioning process might optionally only be performed if an overall power score is determined to be unacceptable; otherwise, only a power aware ordering may be executed.

Figure 7:
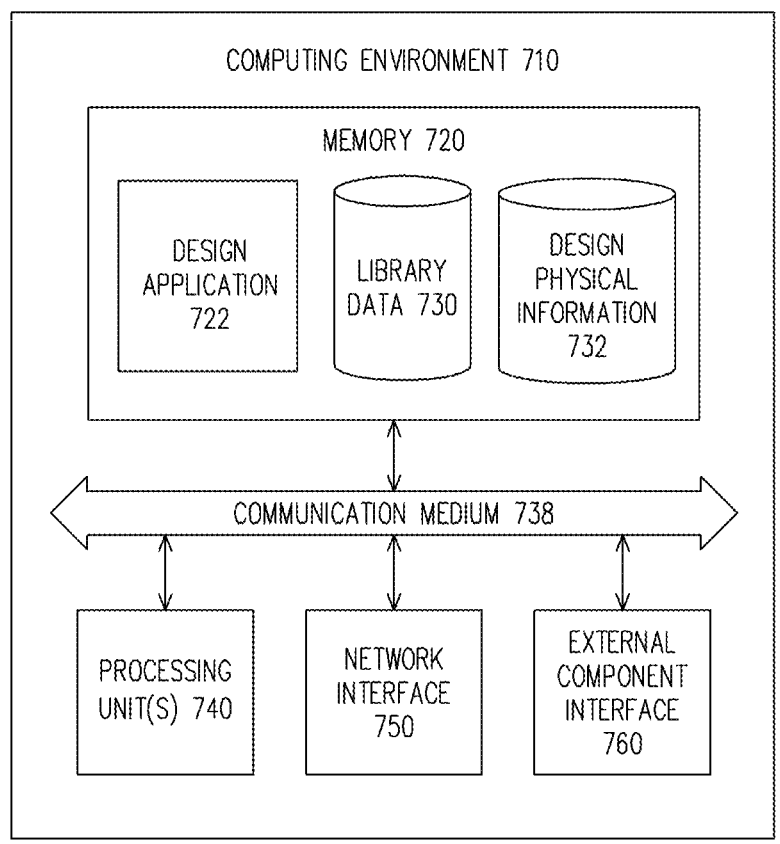
FIG. 7 illustrates an example computing system useable to implement embodiments of partitioning a circuit into scan chains based on anticipated power consumption of circuit features.

FIG. 7 illustrates an example system 700 useable to implement embodiments of partitioning a circuit into scan chains based on anticipated power consumption of circuit features. In an example, the system 700 can include a computing environment 710. The computing environment 710 can be a physical computing environment, a virtualized computing environment, or a combination thereof. The computing environment 710 can include memory 720, a communication medium 738, one or more processing units 740, a network interface 750, and an external component interface 760.

The memory 720 can include a computer readable storage medium. The computer storage medium can be a device or article of manufacture that stores data and/or computer-executable instructions. The memory 720 can include volatile and nonvolatile, transitory and non-transitory, removable and non-removable devices or articles of manufacture implemented in any method or technology for storage of information, such as computer readable instructions, data structures, program modules, or other data. By way of example, and not limitation, computer storage media may include dynamic random access memory (DRAM), double data rate synchronous dynamic random access memory (DDR SDRAM), reduced latency DRAM, DDR2 SDRAM, DDR3 SDRAM, solid state memory, read-only memory (ROM), electrically-erasable programmable ROM, optical discs (e.g., CD-ROMs, DVDs, etc.), magnetic disks (e.g., hard disks, floppy disks, etc.), magnetic tapes, and other types of devices and/or articles of manufacture that store data.

The memory 720 can store various types of data and software. For example, as illustrated, the memory 720 includes a circuit design program 722 that is useable to define a design file for an integrated circuit, as well as for analyzing such a design file for purposes of integrating one or more scan chains therein. In some examples, the circuit design program 722 can include instructions for calculating power scores for one or more circuit cells included in a circuit design, as well as instructions for calculating interconnect power scores. In some further examples, the circuit design program 722 can include instructions for aggregating such power scores and implementing the methods described and reflected above in FIGS. 1-6.

The communication medium 738 can facilitate communication among the components of the computing environment 710. In an example, the communication medium 738 can facilitate communication among the memory 720, the one or more processing units 740, the network interface 750, and the external component interface 760. The communications medium 738 can be implemented in a variety of ways, including but not limited to a PCI bus, a PCI express bus accelerated graphics port (AGP) bus, a serial Advanced Technology Attachment (ATA) interconnect, a parallel ATA interconnect, a Fiber Channel interconnect, a USB bus, a Small Computing system interface (SCSI) interface, or another type of communications medium.

The one or more processing units 740 can include physical or virtual units that selectively execute software instructions. In an example, the one or more processing units 740 can be physical products comprising one or more integrated circuits. The one or more processing units 740 can be implemented as one or more processing cores. In another example, one or more processing units 740 are implemented as one or more separate microprocessors. In yet another example embodiment, the one or more processing units 740 can include an application-specific integrated circuit (ASIC) that provides specific functionality. In yet another example, the one or more processing units 740 provide specific functionality by using an ASIC and by executing computer-executable instructions.

The network interface 750 enables the computing environment 710 to send and receive data from a communication network. The network interface 750 can be implemented as an Ethernet interface, a token-ring network interface, a fiber optic network interface, a wireless network interface (e.g., WI-FI), or another type of network interface.

The external component interface 760 enables the computing environment 710 to communicate with external devices. For example, the external component interface 760 can be a USB interface, Thunderbolt interface, a Lightning interface, a serial port interface, a parallel port interface, a PS/2 interface, and/or another type of interface that enables the computing environment 710 to communicate with external devices. In various embodiments, the external component interface 760 enables the computing environment 710 to communicate with various external components, such as external storage devices, input devices, speakers, modems, media player docks, other computing devices, scanners, digital cameras, and fingerprint readers.

Although illustrated as being components of a single computing environment 710, the components of the computing environment 710 can be spread across multiple computing environments 710. For example, one or more of instructions or data stored on the memory 720 may be stored partially or entirely in a separate computing environment 710 that is accessed over a network.

Referring to FIGS. 1-7 generally, it is noted that the present disclosure illustrates a number of advantages of power-aware scan chain design relative to existing scan chain design approaches. For example, the approach described herein is not dependent upon the test pattern generated by an automatic test pattern generator, but rather accounts for worst-case circuit transitions caused by a test pattern. Furthermore, the approach described herein distributes scan chains across the circuit design to spread out heat generation across different areas of a circuit and across scan chains, while also minimizing interconnect power consumption. Still further, this approach can be used in coexistence with existing scan chain designs, for example by assessing other existing scan chain designs and selectively modifying them to account for a power budget of a planned circuit, such as in FIGS. 5-6. Still other advantages are reflected above in conjunction with the description of the various embodiments herein.

Accordingly, in some aspects, a method of scan partitioning a circuit is disclosed. The method includes calculating a power score for each of a plurality of circuit cells within a circuit design based on one or more physical cell parameters of the plurality of circuit cells used in the circuit design. For each of the plurality of circuit cells, the circuit cell is assigned to a scan group from among a plurality of scan groups according to the power score for the circuit cell and a total power score for each scan group. Furthermore, a plurality of scan chains are formed. Each of the plurality of scan chains is formed from the circuit cells in a corresponding scan group of the plurality of scan groups based at least in part on placement data within the circuit design for each of the circuit cells included in the corresponding scan group.

In further aspects, a method of scan partitioning a circuit is disclosed. The method includes calculating a power score for each of a plurality of circuit cells within a circuit design based on one or more physical cell parameters of the plurality of circuit cells used in the circuit design and independently of a test pattern to be applied to the circuit. The method includes, for each of the plurality of circuit cells, assigning the circuit cell to a scan group from among a plurality of scan groups based on the power score for the circuit cell and a total power score for each scan group, and, for each scan group, forming a scan chain for each of the circuit cells included in the scan group.

In still further aspects, a system of partitioning circuit cells of a circuit design into scan groups useable to form scan chains in the circuit design is disclosed. The system includes a programmable circuit and a memory operatively connected to the programmable circuit. The memory stores instructions which, when executed by the programmable circuit, cause the system to perform calculating a power score for each of a plurality of circuit cells within a circuit design based on one or more physical cell parameters of the plurality of circuit cells used in the circuit design, and sorting the plurality circuit cells according to the power score. The instructions further cause the system to perform defining a plurality of scan groups, and selecting a highest unassigned circuit cell of the plurality of circuit cells. The instructions further cause the system to perform assigning the highest unassigned circuit cell to a scan group of the plurality of scan groups having a lowest aggregate power score.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of scan partitioning a circuit, the method comprising:
   calculating a power score for each of a plurality of circuit cells within a circuit design based on one or more physical cell parameters of the plurality of circuit cells used in the circuit design;
   for each of the plurality of circuit cells, assigning the circuit cell to a scan group from among a plurality of scan groups according to the power score for the circuit cell and a total power score for each scan group; and
   forming a plurality of scan chains, wherein each of the plurality of scan chains is formed from the circuit cells in a corresponding scan group of the plurality of scan groups based at least in part on placement data within the circuit design for each of the circuit cells included in the corresponding scan group.

2. The method of claim 1, further comprising ordering a plurality of circuit blocks included in a scan chain based at least in part on minimization of an interconnect power score defined by power consumption of interconnects between consecutive flops in the scan chain.

3. The method of claim 1, further comprising:
   determining whether a power score for the circuit design including the plurality of scan chains, and,
   based on a determination that the power score is above a threshold, ordering a plurality of circuit blocks included in a scan chain based at least in part on minimization of an interconnect power score defined by power consumption of interconnects between consecutive flops in the scan chain.

4. The method of claim 3, wherein the power consumption of interconnects between two consecutive flops in the scan chain is calculated as follows:

$$(_{i=1}\Sigma^n L_i/W_i) + N_{via}$$

wherein n is the number of metal layers, $L_i$ is a length of wire in the $i^{th}$ metal layer, $W_i$ is a width of the interconnect in the $i^{th}$ metal layer, and $N_{via}$ is a number of vias between the two consecutive flops.

5. The method of claim 1, wherein calculating a power score comprises identifying one or more of the circuit cells as power hungry circuit cells.

6. The method of claim 1, further comprising:
   determining whether the circuit design and the plurality of scan chains exceeds a power budget of the circuit design; and
   based on a determination that the power budget is not exceeded, determining that the plurality of scan chains can be incorporated into the circuit design.

7. The method of claim 1, wherein calculating a power score based on a circuit design is performed independently of a test pattern to be applied to the circuit.

8. The method of claim 1, wherein assigning the circuit cell to the scan group comprises assigning the circuit cell to a scan group having a lowest total power score from among total power scores of the plurality of scan groups.

9. The method of claim 1, wherein assigning the circuit cell to the scan group comprises:
   determining that two or more scan groups have a same total power score that is a lowest total power score among the plurality of scan groups; and
   assigning the circuit cell to a scan group selected from among the two or more scan groups having a minimum scan length.

10. The method of claim 1, wherein assigning the circuit cell to the scan group comprises:
    determining that two or more scan groups have a same total power score that is a lowest total power score among the plurality of scan groups; and
    determining that the two or more scan groups have a same scan length; and
    assigning the circuit cell to a scan group selected from among the two or more scan groups such that the circuit cell has a maximum distance to a centroid of the scan group.

11. The method of claim 1, wherein calculating a power score for each circuit cell of the plurality of circuit cells comprises calculating a sum of power scores for each transistor in the circuit cell, each transistor having a power score based at least in part on a threshold voltage of the transistor and a size of the transistor.

12. A method of scan partitioning a circuit, the method comprising:
    calculating a power score for each of a plurality of circuit cells within a circuit design based on one or more physical cell parameters of the plurality of circuit cells used in the circuit design and independently of a test pattern to be applied to the circuit;
    for each of the plurality of circuit cells, assigning the circuit cell to a scan group from among a plurality of scan groups based on the power score for the circuit cell and a total power score for each scan group; and for each scan group, forming a scan chain for each of the circuit cells included in the scan group.

13. The method of claim 12, wherein forming the scan chain for each of the circuit cells is based at least in part on placement data within a circuit design.

14. The method of claim 12, wherein assigning each of the plurality of circuit cells to one of the plurality of scan groups occurs prior to forming any scan chain.

15. The method of claim 12, wherein the circuit design includes a plurality of existing scan chains, the method further comprising, for each existing scan chain, calculating a power score of the existing scan chain based on the power score of the total power score for the scan group and an interconnect power score associated with a routing path between the circuit cells of the existing scan chain.

16. The method of claim 15, wherein the interconnect power score is calculated based on a number of metal layers in the routing path, a length of wire in each metal layer of the routing path, a width of wire in each metal layer of the routing path, and a number of vias in the routing path.

17. The method of claim 12, wherein the power score is based on a number of transistors in the circuit cell, a threshold voltage, and a transistor size.

\* \* \* \* \*